(12) United States Patent
Yu et al.

(10) Patent No.: US 11,638,384 B2
(45) Date of Patent: Apr. 25, 2023

(54) DISPLAY PANEL AND DISPLAY DEVICE HAVING FIRST TRANSISTOR INCLUDING FIRST DRAIN ELECTRODE AND FIRST SOURCE ELECTRODE MADE OF DIFFERENT MATERIALS

(71) Applicant: Tianma Micro-Electronics Co., Ltd., Shenzhen (CN)

(72) Inventors: Haochi Yu, Shanghai (CN); Feng Lu, Shanghai (CN); Yang Zeng, Shanghai (CN); Lu Lian, Shanghai (CN)

(73) Assignee: Tianma Micro-Electronics Co., Ltd., Shenzhen (CN)

( * ) Notice: Subject to any disclaimer, the term of this patent is extended or adjusted under 35 U.S.C. 154(b) by 169 days.

(21) Appl. No.: 17/219,514

(22) Filed: Mar. 31, 2021

(65) Prior Publication Data

US 2021/0217833 A1 Jul. 15, 2021

(30) Foreign Application Priority Data

Dec. 30, 2020 (CN) .......................... 202011614156.0

(51) Int. Cl.
*H01L 29/08* (2006.01)
*H01L 29/786* (2006.01)
*H01L 27/12* (2006.01)

(52) U.S. Cl.
CPC ......... *H10K 59/123* (2023.02); *H10K 59/124* (2023.02); *H10K 59/126* (2023.02);
(Continued)

(58) Field of Classification Search
CPC ............ H01L 27/3258; H01L 27/3262; H01L 27/3265; H01L 27/3234
(Continued)

(56) References Cited

U.S. PATENT DOCUMENTS

2017/0317110 A1* 11/2017 Lee .................... H01L 29/66969
2018/0151654 A1* 5/2018 Lee .................... H01L 29/41733

FOREIGN PATENT DOCUMENTS

CN 102280467 A 12/2011
CN 102468338 A 5/2012
(Continued)

OTHER PUBLICATIONS

State Intellectual Property Office of the People's Republic of China, Chinese Application No. 202011614156.0, First Office Action, dated Aug. 3, 2022, 18 pages.

*Primary Examiner* — Phuc T Dang
(74) *Attorney, Agent, or Firm* — Christensen O'Connor Johnson Kindness PLLC

(57) ABSTRACT

A display panel and a display device are provided. The display panel includes a substrate, a driving unit including a first transistor, and at least one light-emitting element. The first transistor includes a first source electrode and a first drain electrode that are located at a side of the at least one light-emitting element close to the substrate. Each of the at least one light-emitting element includes a first electrode, a light-emitting layer, and a second electrode that are sequentially stacked. The first electrode is connected to the first drain electrode through a first via, and the first drain electrode is located at a side of the first source electrode close to the substrate. A material of the first drain electrode is different from a material of the first source electrode.

17 Claims, 8 Drawing Sheets

(52) U.S. Cl.
CPC ..... *H10K 59/1213* (2023.02); *H10K 59/1216* (2023.02); *H10K 59/131* (2023.02); *H10K 59/65* (2023.02); *H10K 71/00* (2023.02); *H01L 27/124* (2013.01); *H01L 27/1225* (2013.01); *H01L 27/1251* (2013.01); *H01L 27/1255* (2013.01); *H01L 29/7869* (2013.01); *H01L 29/78633* (2013.01); *H01L 29/78651* (2013.01); *H10K 59/1201* (2023.02)

(58) Field of Classification Search
USPC .......................................................... 257/40
See application file for complete search history.

(56) References Cited

FOREIGN PATENT DOCUMENTS

| | | | |
|---|---|---|---|
| CN | 103227150 | A | 7/2013 |
| CN | 109686770 | A | 4/2019 |
| CN | 110112193 | A | 8/2019 |
| CN | 111092098 | A | 5/2020 |

\* cited by examiner

DISPLAY PANEL AND DISPLAY DEVICE HAVING FIRST TRANSISTOR INCLUDING FIRST DRAIN ELECTRODE AND FIRST SOURCE ELECTRODE MADE OF DIFFERENT MATERIALS

CROSS-REFERENCE TO RELATED APPLICATIONS

The present disclosure claims priority to Chinese Patent Application No. 202011614156.0, filed on Dec. 30, 2020, the content of which is incorporated herein by reference in its entirety.

TECHNICAL FIELD

The present disclosure relates to the field of display technology, and in particular, to a display panel and a display device.

BACKGROUND

In the related art, an existing display panel is formed as a structure in which a plurality of film layers are stacked, and this structure includes a plurality of conductive layers and an insulation layer disposed between adjacent conductive layers. The conductive layers are configured to provide components, such as electrodes and wires. When a conductive structure disposed in a conductive layer needs to be electrically connected to another conductive structure disposed in another conductive layer, a via is formed in the insulation layer between the two conductive layers. However, in the related art, when a conductive structure disposed in a conductive layer is electrically connected to another conductive structure disposed in another conductive layer, the conductive structure arranged in the lower layer may be overetched, resulting in poor electrical connection between the two conductive structures.

SUMMARY

The present disclosure provides a display panel and a display device, aiming to solve the following problem existing in the related art: when a conductive structure arranged in a layer is electrically connected to another conductive structure arranged in another layer through a via, the conductive structure located in the lower layer may be overetched, resulting in poor electrical connection between the two conductive structures.

In a first aspect, an embodiment of the present disclosure provides a display panel that includes a substrate, a driving unit including a first transistor, and at least one light-emitting element. The first transistor includes a first source electrode and a first drain electrode. Each of the at least one light-emitting element includes a first electrode, a light-emitting layer, and a second electrode that are sequentially stacked, the first electrode is connected to the first drain electrode through a first via, and the first drain electrode is located at a side of the first source electrode close to the substrate. The first source electrode and the first drain electrode are located at a side of the at least one light-emitting element close to the substrate. A material of the first drain electrode is different from a material of the first source electrode.

In a second aspect, an embodiment of the present disclosure provides a display device that includes the display panel according to embodiments of the present disclosure.

The display panel and the display device of the present disclosure have the following beneficial effects. In the display panel of the present disclosure, the light-emitting element is located at a side of the first transistor facing away from the substrate, and the first electrode of the light-emitting element is electrically connected to the first drain electrode through the via formed in an insulation layer. The material of the first drain electrode is different from the material of the first source electrode. A metal layer may be provided between the first electrode and the first drain electrode. In this case, in order to achieve electrical connection between the first electrode and the first drain electrode, when the metal layer is etched and formed with an opening, the first drain electrode cannot be overetched, so that good electrical connection performance between the first electrode and the first drain electrode can be achieved, thereby improving performance reliability of the display panel.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described below are merely some embodiments of the present disclosure, and other drawings may be obtained by those skilled in the art without inventive step.

DESCRIPTION OF EMBODIMENTS

In order to make the purpose, technical solutions, and advantages of embodiments of the present disclosure clearer, the technical solutions in the embodiments of the present disclosure are described hereinafter with reference to the accompanying drawings. It should be understood that the described embodiments are merely some of, rather than all of the embodiments of the present disclosure, which shall not be interpreted as providing limitations to the present disclosure. All other embodiments obtained by those skilled in the art according to the embodiments of the present disclosure shall fall within the scope of the present disclosure.

The terms used in the embodiments of the present disclosure are merely for the purpose of describing particular embodiments, but not intended to limit the present disclosure. The singular form expressions "a", "an", "the" and "said" used in the embodiments and appended claims of the present disclosure are also intended to represent plural form expressions thereof unless otherwise stated in the context.

Figure 1:
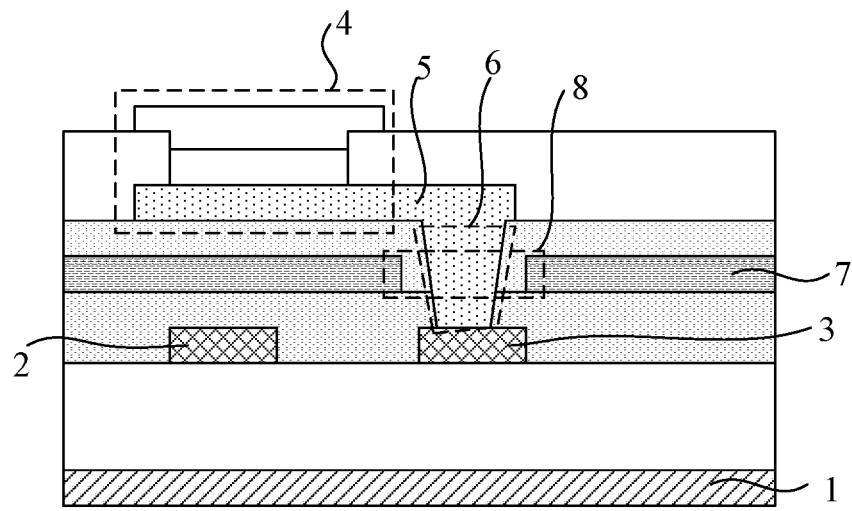
FIG. 1 is a schematic sectional view of a display panel in the related art.

FIG. 1 is a schematic sectional view of a display panel in the related art. The display panel includes a substrate 1, a source electrode 2 and a drain electrode 3 provided on the substrate 1, and a first electrode 5 of a light-emitting element 4, as shown in FIG. 1. The source electrode 2 and the drain electrode 3 are located in a same layer. The first electrode 5 is electrically connected to the drain electrode 3 through a via 6 formed in an insulation layer (not shown in the drawing). A metal layer 7 is further provided between the drain electrode 3 and the first electrode 5. An opening 8 is formed in the metal layer 7, in order to achieve electrical connection between the first electrode 5 and the drain electrode 3. As for the display panel in the related art, the source electrode 2 and the drain electrode 3 of a transistor are formed of a same material and arranged in the same layer. When the metal layer 7 is further formed on the transistor, the metal layer 7 is formed of a material that is the same as the material of the source electrode 2 and the drain electrode 3, so as to achieve a simple manufacturing process. Since the metal layer 7 is formed of the material that is the same as the material of the source electrode 2 and the drain electrode 3, the drain electrode 3 may be overetched in a process of etching the metal layer 7 to form the opening 8, thereby affecting contacting performance between the first electrode 5 and the drain electrode 3 to result in poor electrical connection, which affects reliability of the display panel.

In view of the technical problems existing in the related art, embodiments of the present disclosure provide a display panel. A material of a first drain electrode of a first transistor is different from a material of a first source electrode of the first transistor, to avoid that the first drain electrode is overetched in a process of etching a metal layer between the first electrode and the first drain electrode, thereby achieving good electrical connection performance between the first electrode and the first drain electrode.

Figure 2:
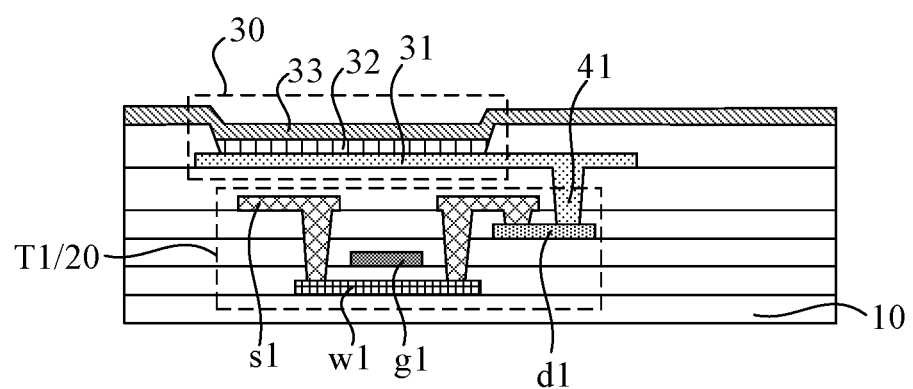
FIG. 2 is a schematic sectional view of a display panel according to an embodiment of the present disclosure.
Figure 3:
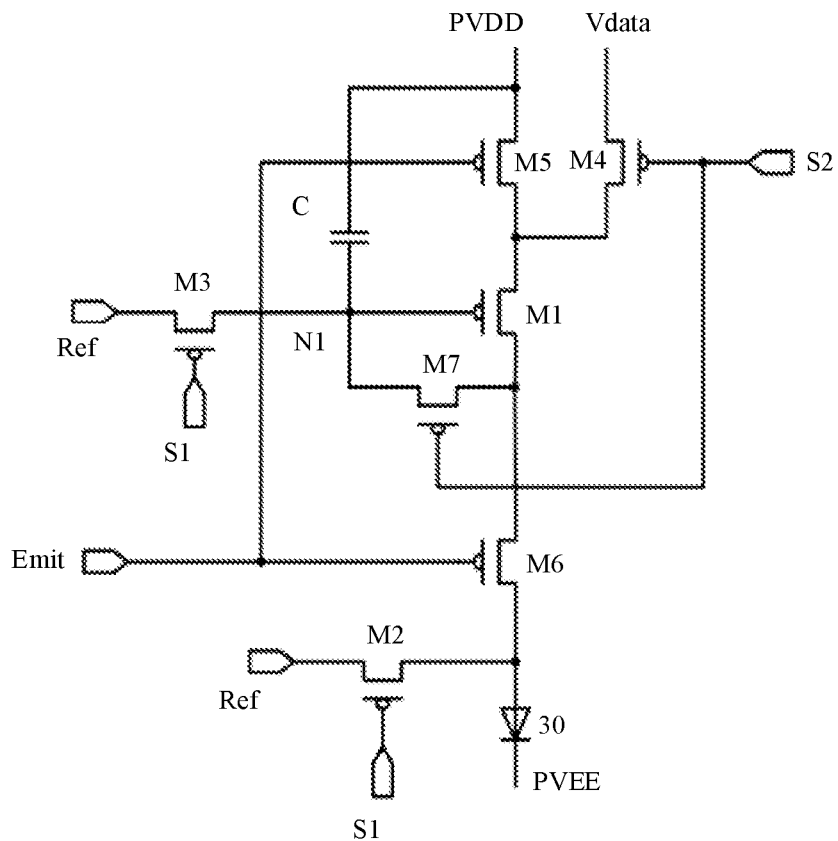
FIG. 3 is a schematic diagram showing a structure of a driving unit of a display panel according to an embodiment of the present disclosure.

FIG. 2 is a schematic sectional view of a display panel according to an embodiment of the present disclosure. FIG. 3 is a schematic diagram showing a structure of a driving unit of a display panel according to an embodiment of the present disclosure. The display panel includes a substrate 10, a driving unit 20, and a light-emitting element 30, as shown in FIG. 2. The driving unit 20 includes a first transistor T1.

The first transistor T1 includes a first source electrode s1 and a first drain electrode d1, which are located at a side of the light-emitting element 30 close to the substrate 10. FIG. 2 further illustrates a first gate electrode g1 and a first active layer w1 of the first transistor T1. FIG. 2 schematically illustrates that the first gate g1 is located at a side of the first active layer w1 facing away from the substrate 10. The first source electrode s1 and the first drain electrodes d1 are respectively connected to the first active layer w1. In FIG. 2, a position of the layer where the first drain electrode d1 is located and a connecting manner of the first drain electrode d1 and the first active layer w1 are merely schematically illustrated. In the following embodiments, the position of the layer where the first drain electrode d1 is located and the connecting manner of the first drain electrode d1 and the first active layer w1 will be described in detail.

The light-emitting element 30 includes a first electrode 31, a light-emitting layer 32, and a second electrode 33 that are sequentially stacked. The first electrode 31 is connected to the first drain electrode d1 through a first via 41, and the first drain electrode d1 is located at a side of the first source electrode s1 close to the substrate 10. In an embodiment, the first electrode 31 is an anode, and the second electrode 33 is a cathode. In this embodiment of the present disclosure, a material of the first drain electrode d1 is different from a material of the first source electrode s1. That is, the first drain electrode d1 and the first source electrode s1 are manufactured in different processes, and the first drain electrode d1 and the first source electrode s1 are arranged in different layers.

The driving unit 20 is configured to drive the light-emitting element 30 to emit light, and FIG. 2 is only a simplified illustration. FIG. 3 illustrates a structure of a driving unit. The driving unit includes seven transistors and one storage capacitor C. A transistor M1 is a driving transistor, and all other transistors (M2 to M7) are switching transistors. FIG. 3 further illustrates a positive power voltage terminal PVDD, a negative power voltage terminal PVEE, a data voltage terminal Vdata, a first scan voltage terminal S1, a second scan voltage terminal S2, a reset power supply terminal Vref, and a light-emitting control terminal Emit. In a structure of this driving unit, the first electrode of the light-emitting element 30 is electrically connected to the drain electrode of the transistor M6, and the second electrode of the light-emitting element 30 is connected to the negative power voltage terminal PVEE. The positive power voltage terminal PVDD provides a positive power voltage signal, and the negative power voltage terminal PVEE provides a negative power voltage signal.

In the display panel according to this embodiment of the present disclosure, the light-emitting element is located at a side of the first transistor facing away from the substrate, and the first electrode of the light-emitting element is electrically connected to the first drain electrode through the via in the insulation layer. The material of the first drain electrode is different from the material of the first source electrode. A metal layer is provided between the first electrode and the first drain electrode, in order to achieve electrical connection between the first electrode and the first drain electrode. Accordingly, when the metal layer is etched to form an opening, the first drain electrode cannot be overetched, therefore facilitating good electrical connection between the first electrode and the first drain electrode, thereby improving performance and reliability of the display panel.

Figure 4:
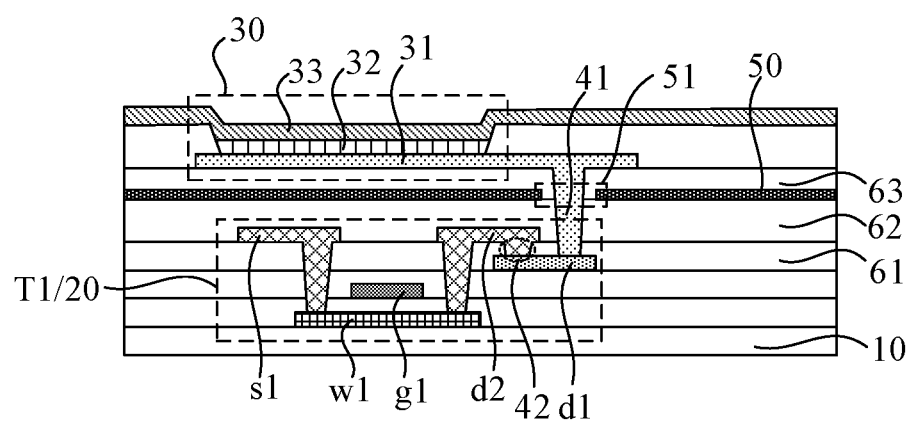
FIG. 4 is a schematic sectional view of another display panel according to an embodiment of the present disclosure.

FIG. 4 is a schematic sectional view of another display panel according to an embodiment of the present disclosure.

Figure 5:
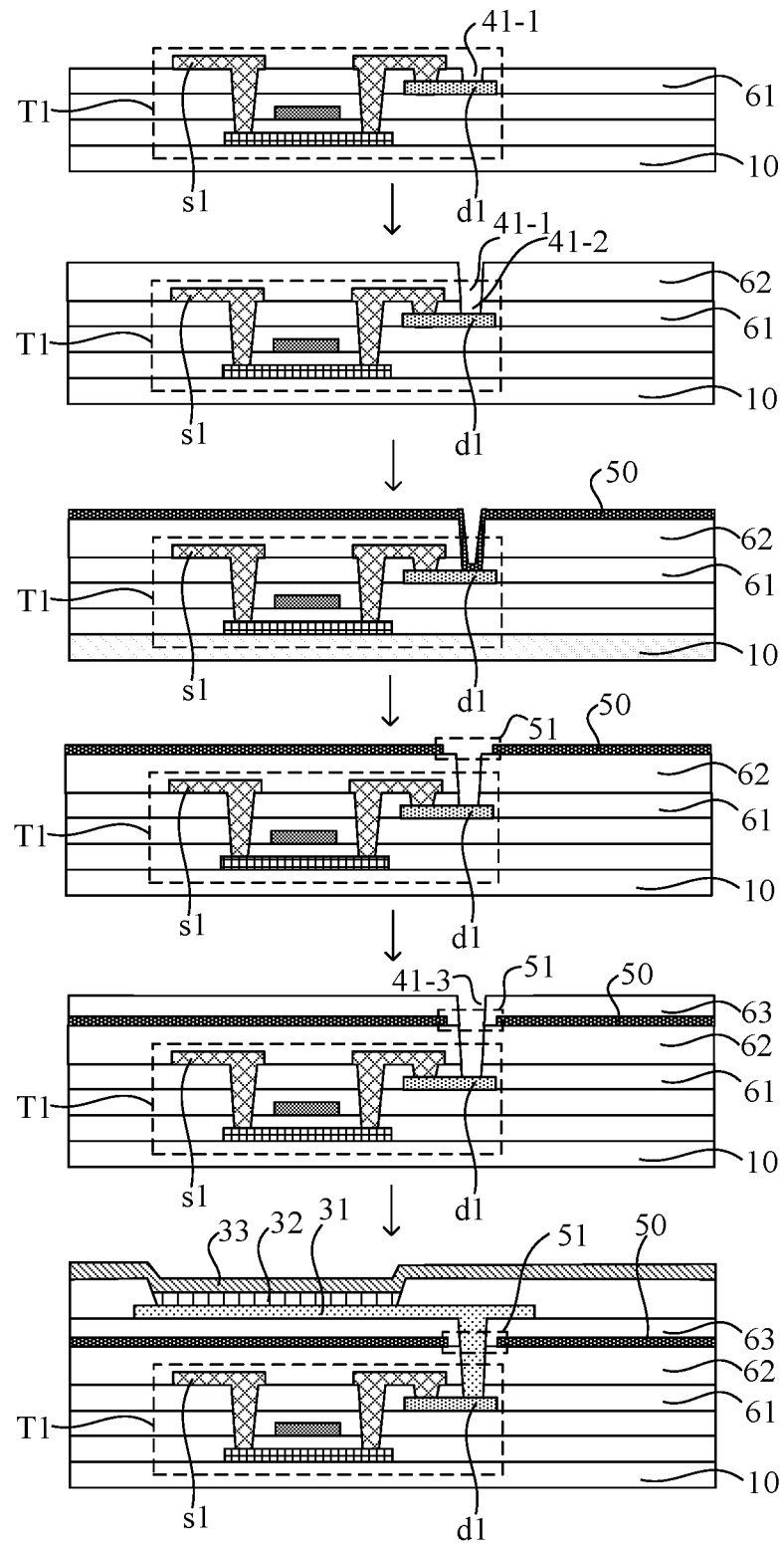
FIG. 5 is a flow chart of a method for manufacturing the display panel according to the embodiment shown in FIG. 4.

FIG. 5 is a flow chart of a method for manufacturing the display panel according to the embodiment shown in FIG. 4

Referring to FIG. 4, the display panel further includes a light shielding layer 50 that is formed of a metal material. The light shielding layer 50 is located between the first drain electrode d1 and the first electrode 31. The material of the light shielding layer 50 is different from the material of the first drain electrode d1. The light shielding layer 50 includes a first opening 51, and an orthographic projection of the first via 41 on the substrate 10 is located within an orthographic projection of the first opening 51 on the substrate 10. The light shielding layer 50 includes the first opening 51, and the first via 41 penetrates through the layer where the light shielding layer 50 is located through the first opening 51, so that the first electrode 31 and the first drain electrode d1 are insulated from the light shielding layer 50 when the first electrode 31 is connected to the first drain electrode d1 through the via.

FIG. 4 further illustrates that the first transistor T1 includes a second drain electrode d2, the first drain electrode d1 is connected to the first active layer w1 through the second drain electrode d2, and the first drain electrode d1 is connected to the second drain electrode d2 through a second via 42. A first insulation layer 61 is provided between the first drain electrode d1 and the second drain electrode d2, and the second via 42 penetrates through the first insulation layer 61. A second insulation layer 62 is provided between the second drain electrode d2 and the light shielding layer 50, and a third insulation layer 63 is provided between the light shielding layer 50 and the first electrode 31. The first via 41 penetrates through the third insulation layer 63, the second insulation layer 62, and the first insulation layer 61.

FIG. 5 illustrates a method for manufacturing a portion of a layer structure of a display panel. Referring to FIG. 5, the first transistor T1 is firstly formed on the substrate 10. In order to achieve electrical connection between the first electrode 31 and the first drain electrode d1, an opening 41-1 is preformed in the first insulation layer 61 to expose the first drain electrode d1. The second insulation layer 62 is then formed on the first transistor T1, the second insulation layer 62 includes an opening 41-2 corresponding to the opening 41-1, and the opening 41-1 overlaps the opening 41-2 to expose the first drain electrode d1. After that, an entire layer of light shielding layer 50 is formed on the second insulation layer 62, and a material of the light-shielding layer is filled at an overlapping position of the opening 41-1 and the opening 41-2. The light shielding layer 50 is etched to form the first opening 51, which corresponds to the opening 41-1 and the opening 41-2 to expose the first drain electrode d1. The third insulation layer 63 is then formed on the light shielding layer 50, and the third insulation layer includes an opening 41-3. After that, the first electrode 31, the light-emitting layer 32, and the second electrode 33 of the light-emitting element are sequentially formed on the third insulation layer 63, and the first electrode 31 is electrically connected to the first drain electrode d1 through an opening penetrating through the third insulation layer 63, the second insulation layer 62 and the first insulation layer 61. In an embodiment of the present disclosure, the material of the first drain electrode d1 is different from the material of the light shielding layer 50. In this case, when the light shielding layer 50 is etched, an etching solution has less influence on the first drain electrode d1 and thus cannot overetch the first drain electrode d1. In an embodiment of the present disclosure, the material of the first drain electrode is different from the material of the first source electrode, for example, the material of the first source electrode includes titanium and aluminum. When the first drain electrode is located in the same layer as a second electrode plate of the storage capacitor, the material of the first drain electrode includes molybdenum. When the first drain electrode is located in the same layer as the first gate electrode of the first transistor, the material of the first drain electrode includes molybdenum. When the first drain electrode is located in the same layer as the first active layer of the first transistor, the material of the first drain electrode includes silicon. When the first drain electrode is located in the same layer as a second active layer of a second transistor, the material of the first drain electrode includes oxide semiconductor. A position of the first drain electrode will be described in detail in the following embodiments. When a metal layer, such as a light shielding layer, is provided between the first electrode and the first drain electrode, the metal layer is commonly formed of a material that is the same as the material of the first source electrode. The metal layer is etched to form openings, in order to achieve electrical connection between the first electrode and the first drain electrode. In this embodiment of the present disclosure, the material of the first drain electrode is different from the material of the first source electrode, and the material of the first drain electrode is different from the material of the metal layer. In this case, when the metal layer is etched and formed with an opening, the first drain electrode cannot be overetched.

In addition, it should be noted that in the process for manufacturing the display panel, the source electrode, drain electrode, gate electrode, and some other metal structures in a transistor device are all formed by a wet etching process. The wet etching process is a process whereby a target material is corroded and removed through a chemical reaction between the target material and the etching solution. That is, the etching solution chemically reacts with a material to be etched during the wet etching process. Different metal materials have different chemical properties, therefore, an etching solution that is reactive with a specific metal material is not suitable for etching all metal materials in order to guarantee an etching efficiency of the wet etching process. The etching solution for etching a metal material is not suitable for etching a semiconductor material such as silicon or oxide semiconductor. That is, the etching solution for corroding the material of the first source electrode has poor corrosion performance on the first drain electrode. Therefore, when the metal layer between the first drain electrode and the first electrode is etched with the etching solution and thus formed with an opening, the etching solution has little influence on the first drain electrode and cannot overetch the first drain electrode.

The light shielding layer 50 in the embodiment of FIG. 4 is used as a functional layer of the display panel. For example, an imaging aperture for fingerprint imaging is formed in the light shielding layer 50 to achieve application of fingerprint recognition under a screen of the display panel. The light shielding layer 50 is formed of a metal material and may be accessed to a potential, to reduce a voltage drop of some functional structures in the display panel and reduce power consumption loss. The light shielding layer 50 will be described in detail in the following embodiments. A position of the layer where the first drain electrode is located and a connecting manner between the first drain electrode and the first active layer according to embodiments of the present disclosure will be described hereinafter.

In some embodiments, the first transistor further includes a second drain electrode and a first active layer, and the first drain electrode is connected to the first active layer through the second drain electrode. The first drain electrode is connected to the second drain electrode through the second via. As shown in FIG. 4, the second drain electrode d2 is located at a side of the first drain electrode d1 facing away from the substrate 10. The connection between the first drain electrode d1 and the first active layer w1 is achieved by providing the second drain electrode d2, and the material of the first drain electrode d1 is different from the material of the first source electrode s1. Therefore, when the metal layer provided between the first electrode and the first drain electrode is etched and formed with an opening, the first drain electrode will not be overetched, thereby achieving good electrical connection performance between the first electrode and the first drain electrode.

Figure 6:
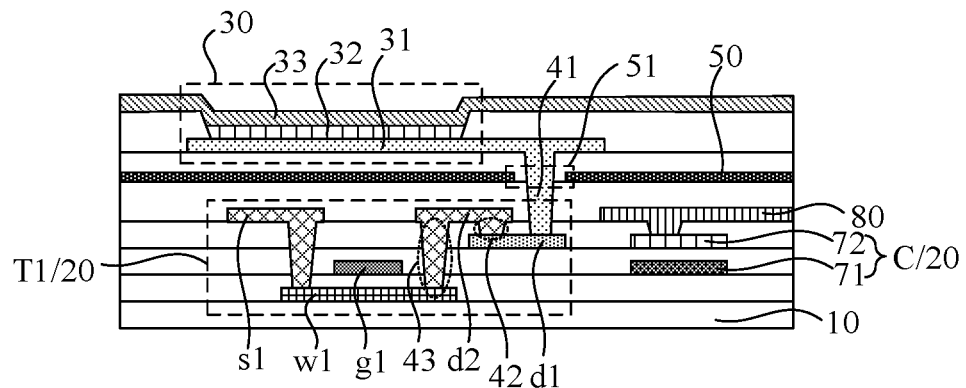
FIG. 6 is a schematic sectional view of another display panel according to an embodiment of the present disclosure.

FIG. 6 is a schematic sectional view of another display panel according to an embodiment of the present disclosure. In an embodiment, as shown in FIG. 6, the second drain electrode d2 is disposed at the side of the first drain electrode d1 facing away from the substrate 10, and the first drain electrode d1 is connected to the first active layer w1 through the second drain electrode d2. The second drain electrode d2 and the first source electrode s1 are located in a same layer, and the second drain electrode d2 is connected to the first active layer w1 through a third via 43. FIG. 6 also shows that the driving unit 20 further includes a storage capacitor C. The storage capacitor C includes a first electrode plate 71 and a second electrode plate 72. The first electrode plate 71 is located in the same layer as the first gate electrode g1 of the first transistor T1, that is, the first electrode plate 71 and the first gate electrode g1 are formed in a same process. The second electrode plate 72 is located between the first gate electrode g1 and the first source electrode s1. The display panel further includes a power supply structure 80, and the power supply structure 80 and the first source electrode s1 are located in a same layer. In an embodiment, the power supply structure 80 is a positive power supply structure, and the power supply structure 80 provides a positive power voltage terminal for the driving power supply 20. In an example, it should be understood in combination with the schematic structure diagram of FIG. 3 that the second electrode plate 72 of the storage capacitor C is connected to the power supply structure 80 and the power supply structure 80 provides a voltage signal to the second electrode plate 72. The first electrode plate 71 of the storage capacitor C is connected to a first node N1.

In this embodiment, the material of the first drain electrode is different from the material of the first source electrode. Therefore, when the metal layer provided between the first electrode and the first drain electrode is etched and formed with an opening, the first drain electrode will not be overetched, thereby achieving good electrical connection performance between the first electrode and the first drain electrode. Meanwhile, the first drain electrode is connected to the first active layer through the second drain electrode, and the second drain electrode and the first source electrode are located in the same layer. In this way, the third via for connecting the second drain electrode and the first active layer and the t via for connecting the first source electrode and the first active layer can be formed in a same process, thereby simplifying the manufacturing process.

With further reference to FIG. 6, the first drain electrode d1 and the second electrode plate 72 are located in the same layer. The first drain electrode d1 and the second electrode plate 72 are formed in a same process, and such arrangement of the first drain electrode d1 does not require for an additional process and does not increase the thickness of the display panel. As for the structure shown in FIG. 6, the conductive layers arranged on the substrate 10 includes a layer including the first active layer w1, a layer including the first gate electrode g1, a layer including the second electrode plate 72, and the light shielding layer 50, and then the light-emitting element 30 is provided on the light shielding layer 50. The layer including the second electrode plate 72 is the layer closest to the first electrode 31, except for the layer including the first source electrode s1. The first drain electrode d1 and the second electrode plate 72 are located in the same layer, such that the first drain electrode d1 and the first source electrode s1 are arranged in different layers and a depth of the first via 41 can be reduced, thereby improving the yield rate of via connection between the first electrode 31 and the first drain electrode d1. In addition, the depth of the first via 41 is small so that an area of the first via 41 can be reduced, thereby reducing an area of the first opening 51 formed in the light shielding layer 50. When the light shielding layer 50 is applied in the fingerprint recognition under the screen, light leakage of the first opening 51 can be reduced and accuracy of fingerprint recognition can be improved.

Figure 7:
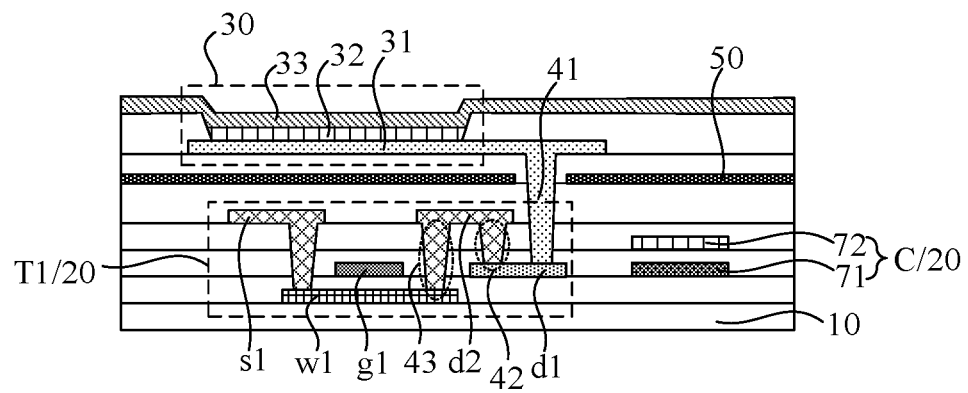
FIG. 7 is a schematic sectional view of another display panel according to an embodiment of the present disclosure.

FIG. 7 is a schematic sectional view of another display panel according to an embodiment of the present disclosure. In another embodiment, as shown in FIG. 7, the second drain electrode d2 is located at the side of the first drain electrode d1 facing away from the substrate 10, and the first drain electrode d1 is connected to the first active layer w1 through the second drain electrode d2. The driving unit 20 further includes a storage capacitor C. The storage capacitor C includes a first electrode plate 71 and a second electrode plate 72. The first electrode plate 71 is located in the same layer as the first gate electrode g1 of the first transistor T1, and the second electrode plate 72 is located between the first gate electrode g1 and the first source electrode s1. In this case, the first drain electrode d1 and the first gate electrode g1 are located in a same layer. In this embodiment, the first drain electrode and the first gate electrode may be formed in a same process, and such arrangement of the first drain electrode d1 does not require for an additional process and does not increase the thickness of the display panel. Moreover, when the metal layer provided between the first electrode and the first drain electrode is etched and formed with an opening, the first drain electrode will not be overetched, thereby achieving good electrical connection between the first electrode and the first drain electrode.

In another embodiment, the second drain electrode is located at the side of the first drain electrode facing away from the substrate, and the first drain electrode is connected to the first active layer through the second drain electrode. The first drain electrode and the first gate electrode are located in a same layer, and the second drain electrode is located in the same layer as the second electrode plate of the storage capacitor, which is not schematically illustrated in drawings herein.

In some embodiments, the first drain electrode is connected to the first active layer through the second drain electrode, and the second drain electrode is located at a side of the first drain electrode close to the substrate. In this case, the second drain electrode is equivalent to a connecting electrode between the first drain electrode and the first active layer. The second drain electrode is located between the first drain electrode and the first active layer in a direction perpendicular to the display panel. The provision of the second drain electrode can reduce a depth of the via in the via connection manner, and improve the reliability of the via connection between the first drain electrode and the second drain electrode and the reliability of the via connection between the second drain electrode and the first active layer. In practice, a position of the layer including the first drain electrode and the second drain electrode can be reasonably configured based on the specific structure of the driving unit.

Figure 8:
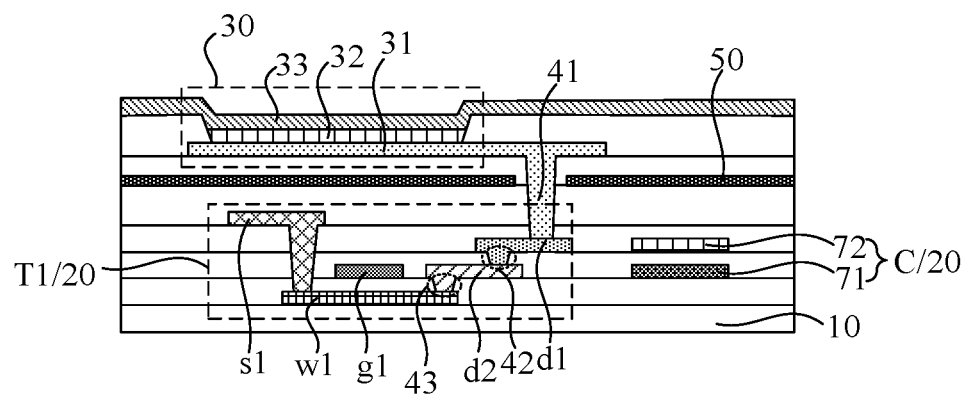
FIG. 8 is a schematic sectional view of another display panel according to an embodiment of the present disclosure.

FIG. 8 is a schematic sectional view of another display panel according to an embodiment of the present disclosure. In an embodiment, as shown in FIG. 8, the first drain electrode d1 is connected to the first active layer w1 through the second drain electrode d2, and the second drain electrode d2 is located at the side of the first drain electrode d1 close to the substrate 10. The first transistor T1 includes a first gate electrode g1 that is located at a side of the first source electrode s1 close to the first active layer w1. The driving unit includes the storage capacitor C that includes a first electrode plate 71 and a second electrode plate 72. The first electrode plate 71 is located in the same layer as the first gate electrode g1 of the first transistor T1, and the second electrode plate 72 is located between the first gate electrode g1 and the first source electrode s1. In this case, the first drain electrode d1 and the second electrode plate 72 are located in the same layer, and the second drain electrode d2 and the first gate electrode g1 are located in a same layer.

Figure 9:
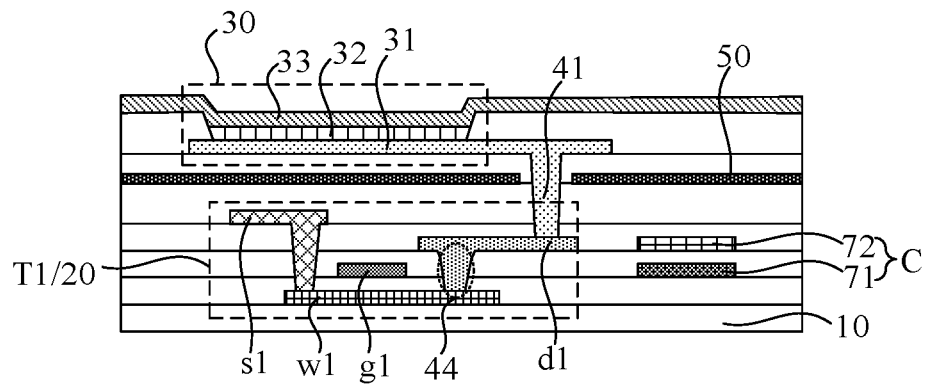
FIG. 9 is a schematic sectional view of another display panel according to an embodiment of the present disclosure.

In some embodiments, the first drain electrode is directly connected to the first active layer through a via. FIG. 9 is a schematic sectional view of another display panel according to an embodiment of the present disclosure. As shown in FIG. 9, the first gate electrode g1 is located at the side of the first source electrode s1 close to the substrate 10, the first active layer w1 is located between the first gate electrode g1 and the substrate 10, and the first drain electrode d1 is connected to the first active layer w1 through a fourth via 44. The storage capacitor C includes the first electrode plate 71 and the second electrode plate 72. The first electrode plate 71 and the first gate electrode g1 are located in a same layer, and the second electrode plate 72 is located between the first gate electrode g1 and the first source electrode s1. In this case, the first drain electrode d1 and the second electrode plate 72 are located in the same layer. In this embodiment, the first drain electrode is directly connected to the first active layer through the via, that is, it is unnecessary to provide other connecting structure between the first drain electrode and the first active layer, thereby reducing a number of vias of the display panel and thus saving wiring space of the display panel.

In another embodiment, the first drain electrode and the first gate electrode are located in the same layer, and the first drain electrode is connected to the first active layer through the fourth via, which is not schematically illustrated in the drawings herein.

In some embodiments, the driving unit includes a first transistor and a second transistor, in which a first active layer of the first transistor contains silicon and a second active layer of the second transistor includes oxide semiconductor. Taking the structure of the driving unit shown in FIG. 3 as an example, the transistor M3 is a node reset transistor, and a drain electrode of the transistor M3 is electrically connected to the first node N1. The transistor M7 is a threshold compensation transistor, and a drain electrode of the transistor M7 is also electrically connected to the first node N1. In an embodiment, the node reset transistor and the threshold compensation transistor both are the second transistors, and all other transistors of the driving unit are the first transistors. The second active layer of the second transistor includes oxide semiconductor that has relatively low leakage current in an off state, thereby reducing the leakage current to the first node N1 and thus facilitating to stabilize a potential of the first node N1 when the driving unit is working in a light-emitting phase. The first active layer of the first transistor contains silicon, which can make the first transistor have a faster switching speed and thus improving responding time of the driving unit.

Figure 10:
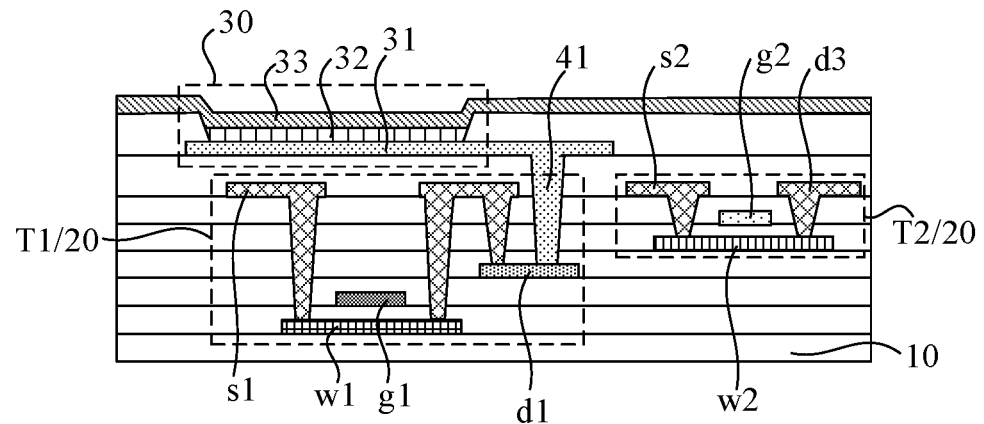
FIG. 10 is a schematic sectional view showing a structure of another display panel according to an embodiment of the present disclosure.

The arrangements provided in the above embodiments of FIG. 2 to FIG. 9 can all be applied to a display panel that includes both the first transistor and the second transistor, for example, the structure of the first drain electrode illustrated in the embodiment of FIG. 2. FIG. 10 is a schematic structural diagram of another display panel according to an embodiment of the present disclosure. Referring to FIG. 10, the first transistor T1 includes the first active layer w1 containing silicon, and the second transistor T2 includes the second active layer w2, which includes oxide semiconductor and is located at the side of the first active layer w1 facing away from the substrate 10. FIG. 10 also illustrates the second gate electrode g2, the second source electrode s2, and the third drain electrode d3 of the second transistor T2. For a display panel in which the driving unit includes the first transistor and the second transistor, the first electrode of the light-emitting element is connected to the first drain electrode of the first transistor. In this embodiment, the material of the first drain electrode is different from the material of the first source electrode. When a metal layer is provided between the first electrode and the first drain electrode, the first drain electrode will not be overetched when the metal layer is etched and formed with an opening, thereby achieving good electrical connection performance between the first electrode and the first drain electrode, and thus improving the performance reliability of the display panel.

Figure 11:
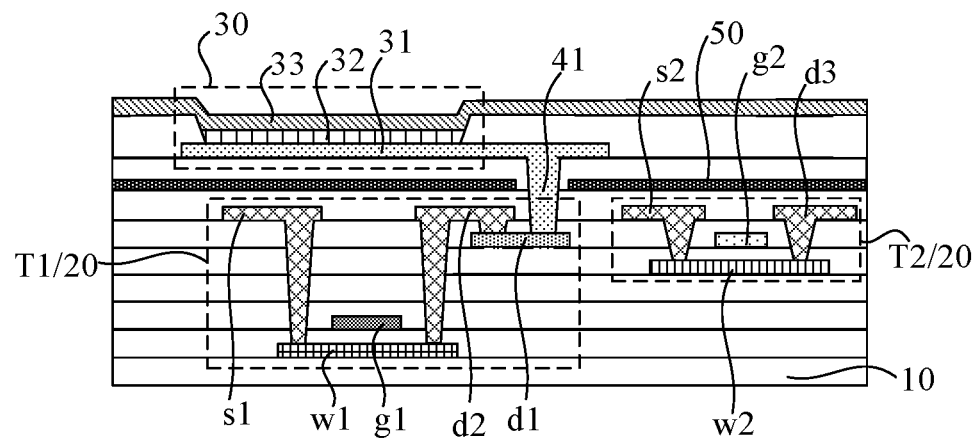
FIG. 11 is a schematic sectional view showing a structure of another display panel according to an embodiment of the present disclosure.

FIG. 11 is a schematic sectional view of another display panel according to an embodiment of the present disclosure. In an embodiment, as shown in FIG. 11, the driving unit further includes a second transistor T2 that includes a second source electrode s2, a third drain electrode d3, a second gate electrode g2, and a second active layer w2. The second active layer w2 includes oxide semiconductor, and the second active layer w2 is located at a side of the first active layer w1 facing away from the substrate 10. The second source electrode s2, the third drain electrode d3 and the first source electrode s1 are located in a same layer, and the second gate electrode g2 is located between the second active layer w2 and the second source electrode s2. The first drain electrode d1 and the second gate electrode g2 are located in a same layer.

Figure 12:
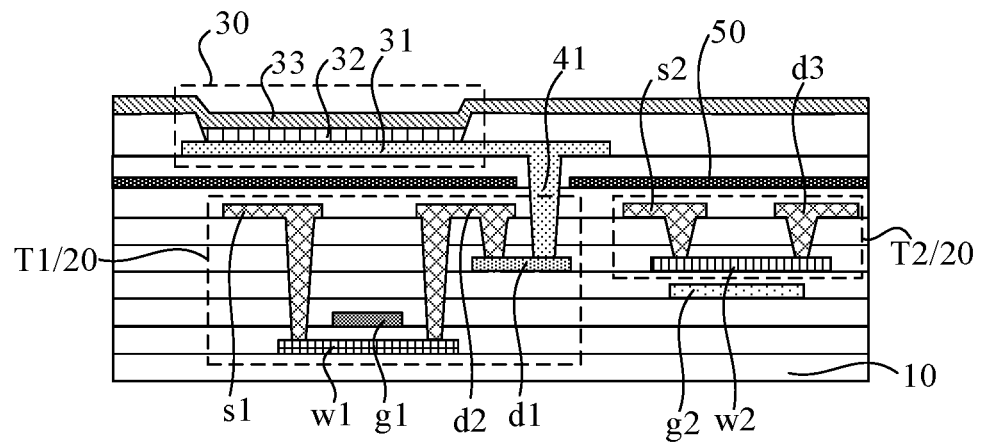
FIG. 12 is a schematic sectional view showing a structure of another display panel according to an embodiment of the present disclosure.

FIG. 12 is a schematic sectional view of another display panel according to an embodiment of the present disclosure. In an embodiment, as shown in FIG. 12, the driving unit includes the first transistor T1 and the second transistor T2, and the first drain electrode d1 of the first transistor T1 and the second active layer w2 of the second transistor T2 are located in a same layer. The first drain electrode d1 and the second active layer w2 are located in a same layer, as shown in FIG. 12.

FIG. 11 shows that the first drain electrode d1 of the first transistor T1 and the second gate electrode g2 of the second transistor T2 are located in the same layer. FIG. 12 shows that the first drain electrode d1 of the first transistor T1 and the second active layer w2 of the second transistor T2 are located in the same layer. In the embodiments of FIG. 11 and FIG. 12, the first drain electrode d1 is connected to the first active layer w1 through the second drain electrode d2, and the second drain electrode d2 is located at the side of the first drain electrode d1 facing away from the substrate 10. In some implementations applied into the above embodiments shown in FIG. 11 and FIG. 12, the second drain electrode may also be located between the first active layer and the first drain electrode, and the first drain electrode is connected to the first active layer through the second drain electrode. In some other implementations applied into the above embodiments shown in FIG. 11 and FIG. 12, the first drain electrode is directly connected to the first active layer through a via. The connecting manner of the first drain electrode and the first active layer may be understood with reference to the above embodiments shown in FIG. 2 to FIG. 9, and details will not be further described herein.

In addition, FIG. 12 shows that the second gate electrode g2 is located between the second active layer w2 and the first active layer w1. In another embodiment, the second transistor includes a second gate electrode and a third gate electrode, in which the second gate electrode is located at a side of the second active layer facing away from the substrate and the third gate electrode is located between the second active layer and the first active layer. In this embodiment, the first drain electrode and the second gate electrode may be located in a same layer, or the first drain electrode and the second active layer may be located in a same layer, which is not schematically illustrated in the drawings herein.

In addition, FIG. 11 and FIG. 12 also show the light shielding layer 50 located between the first transistor T1 and the light-emitting element 30. In order to achieve connection between the first electrode 31 and the first drain electrode d1, the first via 41 penetrates through the layer where the light shielding layer 50 is located. When the light shielding layer 50 is etched, the etching solution will not overetch the first drain electrode, thereby achieving good electrical connection performance between the first electrode and the first drain electrode and improving the performance reliability of the display panel.

Embodiments of the present disclosure including the light-shielding layer will be described in detail hereinafter.

Figure 13:
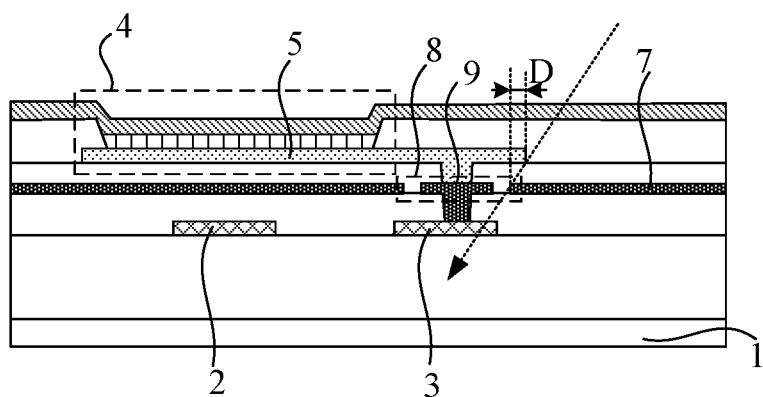
FIG. 13 is a schematic sectional view of another display panel in the related art.

FIG. 13 is a schematic sectional view of another display panel in the related art. Referring to FIG. 13, the metal layer 7 is provided between the drain electrode 3 and the light-emitting element 4, a connecting metal 9 is provided between the first electrode 5 and the drain electrode 3, the connecting metal 9 and the metal layer 7 are located in a same layer, and the first electrode 5 is connected to the drain electrode 3 through the connecting metal 9. When manufacturing the display panel, the metal layer 7 is firstly formed by coating, then the metal layer 7 is etched to form an opening 8 and the connecting metal 9. The connecting metal 9 is located in the opening 8, and the connecting metal 9 contacts the drain electrode 3. When the metal layer 7 is being etched, the etching solution does not contact the drain electrode 3, thereby avoiding overetching the drain electrode 3. In this embodiment, since the connecting metal 9 is located in the opening 8, in order to achieve required contact performance between the connecting metal 9 and the first electrode 5, the connecting metal 9 is configured to have a predetermined area, and the connecting metal 9 is insulated from the metal layer 7. Therefore, an area of the opening 8 is configured to be relatively large. When the first electrode 5 has a constant area, a distance (a distance D shown in FIG. 13) between an edge of the first electrode 5 and an edge of the opening 8 becomes smaller, which will cause light with a titled angle (shown by a dotted line in FIG. 13) to travel through the opening 8 and be emitted downward, that is, light leakage at a position of the opening 8 will be increased. However, in the display panel, the first electrode 5 of each light-emitting element 4 is insulated from each other, and the first electrode 5 has a limited area, so that the light leakage at the position of the opening 8 cannot be reduced by increasing the area of the first electrode 5.

In an embodiment of the present disclosure with reference to FIG. 4, the light shielding layer 50 is located between the first drain electrode d1 and the first electrode 31, the material of the light shielding layer 50 is different from the material of the first drain electrode d1, the light shielding layer 50 includes the first opening 51, and the orthographic projection of the first via 41 on the substrate 10 is located within the orthographic projection of the first opening 51 on the substrate 10. The material of the first drain electrode d1 is different from the material of the light shielding layer 50. Accordingly, when the light shielding layer 50 is etched to form the first opening 51, the etching solution will not overetch the first drain electrode d1, thereby achieving good connection performance between the first electrode 31 and the first drain electrode d1. Moreover, it is unnecessary to form a connecting metal in the light shielding layer 50, so that the area of the first opening 51 will not be increased, and the light leakage at the position of the first opening 51 will not be influenced.

Figure 14:
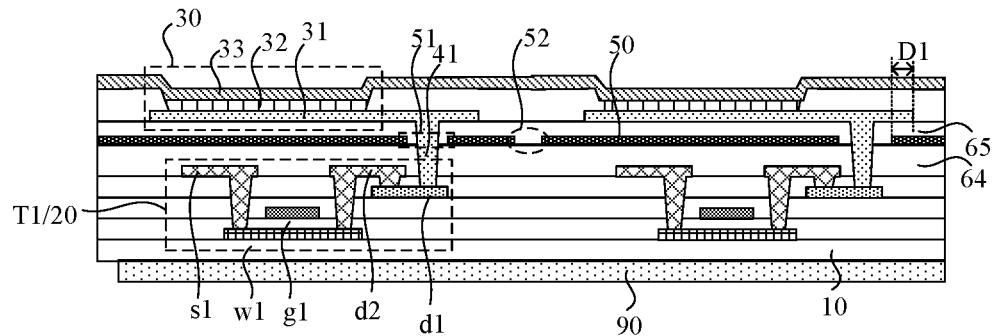
FIG. 14 is a schematic sectional view of another display panel according to an embodiment of the present disclosure.
Figure 15:
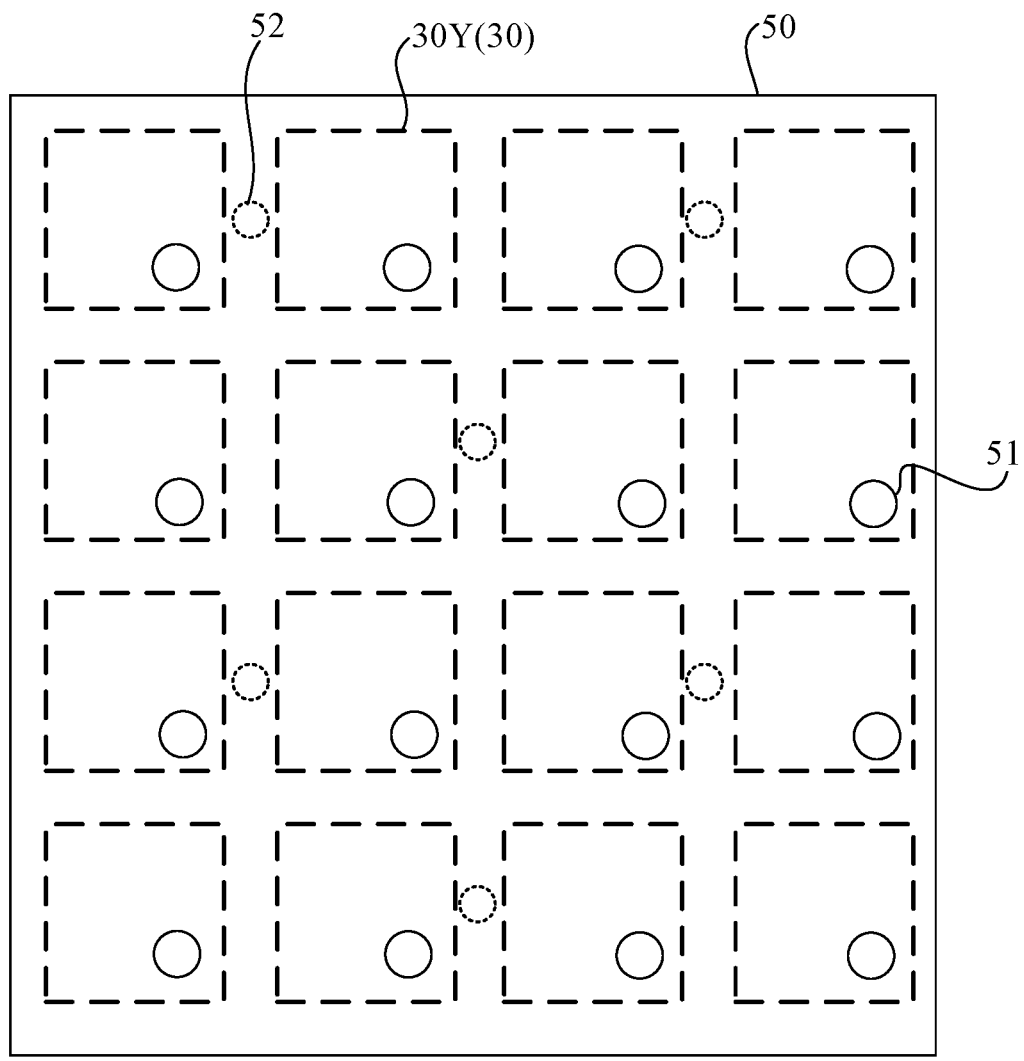
FIG. 15 is a schematic top view of a light shielding layer of a display panel according to an embodiment of the present disclosure.

In an embodiment, the light shielding layer includes a plurality of imaging apertures, which can be applicable in an optical imaging system. FIG. 14 is a schematic sectional view of another display panel according to an embodiment of the present disclosure. FIG. 15 is a schematic top view of a light shielding layer of a display panel according to an embodiment of the present disclosure. As shown in FIG. 14 and FIG. 15, the light shielding layer 50 further includes a plurality of imaging apertures 52, which penetrates through the light shielding layer 50 in a thickness direction of the light shielding layer 50. An orthographic projection of the imaging aperture 52 on the substrate 10 is located between orthographic projections of two adjacent light emitting elements 30 on the substrate 10. The arrangement of the imaging apertures 52 in FIG. 15 is merely for schematic illustration, and FIG. 15 further illustrates orthographic projections 30Y (indicated by dashed lines, and the shape is merely for schematic illustration) of the light emitting elements on the light shielding layer 50. The display panel further includes a photosensitive module 90 that is located at a side of the imaging aperture 52 facing away from the light emitting element 30. The imaging apertures 52 overlap the photosensitive module 90 in a direction perpendicular to the display panel. The photosensitive module 90 includes a plurality of photosensitive elements. During a fingerprint recognition phase, light reflected by a user's finger is transmitted through the light shielding layer 50 via the imaging apertures 52 and is then received by the photosensitive elements of the photosensitive module 90. The photosensitive elements generate electrical signals based on the received light signal. The electrical signals generated by the photosensitive elements are processed to form a fingerprint image signal. For the display panel according to this embodiment, the light shielding layer is formed between the light-emitting elements and the driving unit, and the imaging apertures are formed in the light shielding layer, so that under-screen fingerprint recognition can be achieved. Moreover, the material of the first drain electrode is different from the material of the light shielding layer, so that when the light shielding layer is etched to form the first opening, the etching solution cannot overetch the first drain electrode, thereby achieving good connection performance between the first drain electrode and the first electrode. In this embodiment, good connection performance between the first drain electrode and the first electrode can be achieved without a connecting metal formed in the light shielding layer, so that the area of the first opening will not be increased, and thus light leakage at the position of the first opening will not be influenced. When it is applied in the under-screen fingerprint recognition scheme, light leakage at the position of the first opening can be reduced, thereby reducing influence of light leakage on the fingerprint recognition and thus improving the accuracy of the fingerprint recognition.

In an embodiment, the material of the first source electrode s1 is different from the material of the first gate electrode g1, and the material of the first source electrode s1 is the same as the material of the light shielding layer 50. In an example, the material of the first gate electrode g1 includes molybdenum, and the material of the first source electrode s1 includes titanium and aluminum. Typically, the first source electrode s1 is a three-layer structure formed by titanium, aluminum, and titanium. The display panel further includes a power supply structure provided on the substrate 10, and the power supply structure may be a positive power supply structure or a negative power supply structure. For example, the power supply structure 80 as shown in FIG. 6 is a positive electrode power supply structure, and the light shielding layer 50 is electrically connected to the power supply structure 80. In this embodiment, the light shielding layer is electrically connected to the power supply structure, so that a resistance of the power supply structure can be reduced, thereby reducing a voltage drop of the power supply structure and thus reducing power consumption loss of the display panel. In addition, the material of the light shielding layer is the same as the material of the first source electrode, and the light shielding layer is formed by a material with a lower resistance, so that the voltage drop of the power supply structure can be further reduced.

Figure 16:
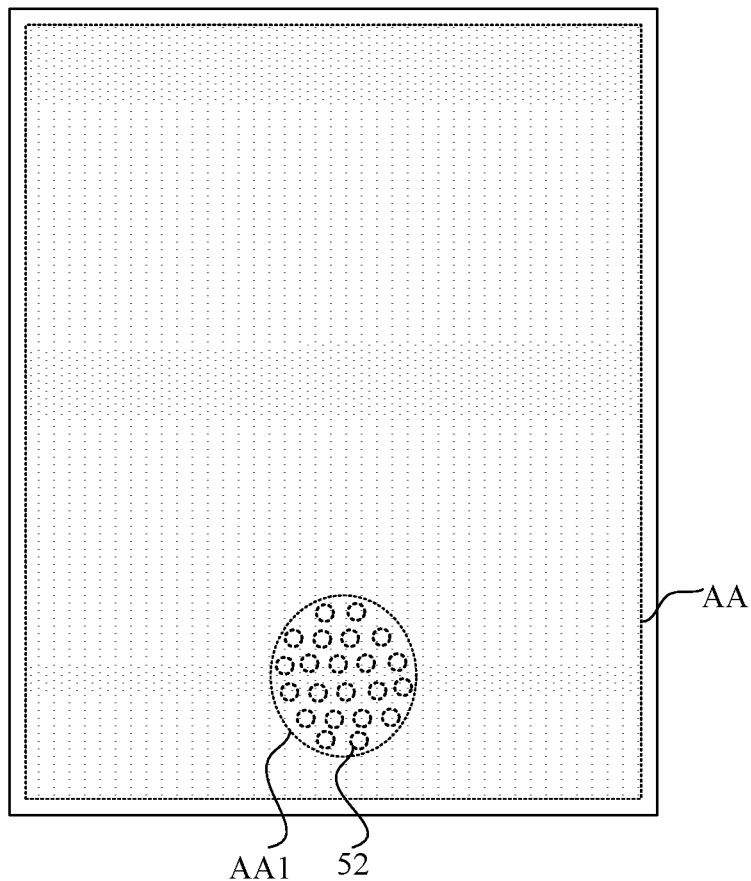
FIG. 16 is a schematic top view of a display panel according to an embodiment of the present disclosure.

FIG. 16 is a schematic top view of a display panel according to an embodiment of the present disclosure. In an embodiment, as shown in FIG. 16, the display panel includes a display region AA that includes a fingerprint recognition region AA1, and the plurality of imaging apertures 52 are formed in the fingerprint recognition region AA1.

In addition, a position of the photosensitive module 90 is not limited in the embodiments of the present disclosure. FIG. 14 schematically shows that the photosensitive module 90 is located at a side of the substrate 10 facing away from the driving unit 20. In another embodiment, the photosensitive module may be located at a side of the substrate close to the driving unit.

With further reference to FIG. 14, the display panel includes a first planarization layer 64 and a second planarization layer 65. The driving unit 20 is located between the substrate 10 and the light emitting elements 30. The first planarization layer 64 covers on the driving unit 20, the light shielding layer 50 covers the first planarization layer 64, and the second planarization layer 65 covers the light shielding layer 50. The first via 41 penetrates through the first planarization layer 64 and the second planarization layer 65. In an example, the first planarization layer 64 and the second planarization layer 65 both are formed of an organic material. The light shielding layer 50 is formed of a metal material. When the display panel displays normally, a portion of the light shielding layer 50 located between two adjacent light-emitting elements 30 has reflecting influence on light. In this embodiment of the present disclosure, the first planarization layer 64 is formed on the driving unit 20, so that the light shielding layer 50 can be formed on a relatively flat surface, so as to obtain the flat light shielding layer 50, thereby making portions of the light shielding layer located between different light-emitting elements be relatively flat. In this way, difference in light reflection of the light shielding layer at different positions can be reduced, thereby reducing influence on the display effect. In addition, the second planarization layer 65 is formed on the light shielding layer 50, such that the light-emitting elements 30 can be formed on a relatively flat surface, thereby avoiding dispersion caused by uneven of a light-emitting area of the light-emitting elements and thus improving the display effect of the display panel.

In addition, as shown in FIG. 14, an orthographic projection of the first electrode 31 on the substrate 10 covers an orthographic projection of the first opening 51 on the substrate 10. That is, the first electrode 31 covers the first opening 51 in the direction perpendicular to the display panel. The first electrode 31 is provided to reduce light leakage at the position of the first opening 51. When the first electrode is applied in the under-screen fingerprint recognition, influence of light leakage on fingerprint recognition can be reduced, thereby improving the accuracy of the fingerprint recognition. Herein, a distance D1 between an edge of the first electrode 31 and an edge of the first opening 51 may be configured with reference to parameters, such as a thickness of the second planarization layer 65 and a pixel density of the display panel. In a case that two adjacent first electrodes 31 are insulated from each other and the first electrodes 31 do not shield the imaging apertures 52, an area of the first electrode 31 can be relatively large, so as to ensure that the first electrode 31 shields the first opening 51, thereby avoiding light leakage.

In an embodiment, the display region is provided with M light-emitting elements, and the light shielding layer overlaps the M light-emitting elements in the direction perpendicular to the display panel. As shown in FIG. 15, one light-emitting element 30 corresponds to a respective first opening 51. That is, the light shielding layer overlaps all the light-emitting elements in the display region, and the light shielding layer is formed in the entire display region, so as to achieve display uniformity of the display panel and avoid local formation of the light shielding layer, which may cause different reflecting degrees of ambient light in different local regions of the display panel and results in display differences.

Figure 17:
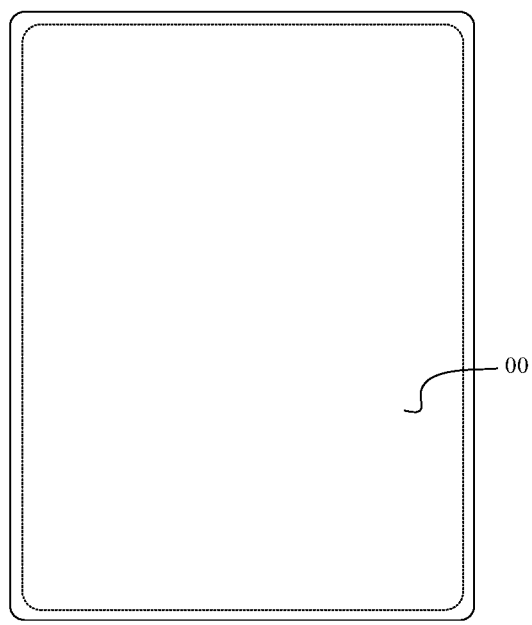
FIG. 17 is a schematic diagram of a display device according to an embodiment of the present disclosure.

An embodiment of the present disclosure further provides a display device. FIG. 17 is a schematic diagram of a display device according to an embodiment of the present disclosure. As shown in FIG. 17, the display device includes a display panel 00 according to any embodiment of the present disclosure. A structure of the display panel has been described in the above embodiments, and will not be repeated herein. In embodiments of the present disclosure, the display device may be any device with a display function, such as a mobile phone, a tablet computer, a notebook computer, an electronic paper book, a television, and a smart wearable product.

The above embodiments are merely preferred embodiments of the present disclosure and are not intended to limit the present disclosure. Any modifications, equivalent substitutions and improvements made within the principle of the present disclosure shall fall into the scope of the present disclosure.

It should be noted that the above embodiments are merely for illustrating the present disclosure but not intended to limit the present disclosure thereto. Although the present disclosure has been described in detail with reference to the above embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:
a substrate;
a driving unit comprising a first transistor, the first transistor comprising a first source electrode and a first drain electrode; and
at least one light-emitting element, each of the at least one light-emitting element comprising a first electrode, a light-emitting layer, and a second electrode that are sequentially vertically stacked, the first electrode being connected to the first drain electrode through a first via, and the first drain electrode being located at a side of the first source electrode close to the substrate,
wherein the first source electrode and the first drain electrode are located at a side of the at least one light-emitting element close to the substrate, and wherein a material of the first drain electrode is different from a material of the first source electrode; and
wherein the first transistor further comprises a second drain electrode and a first active layer, the first drain electrode is connected to the first active layer through the second drain electrode, and the first drain electrode is connected to the second drain electrode through a second via.

2. The display panel according to claim 1, wherein the second drain electrode and the first source electrode are located in a same layer, and the second drain electrode is connected to the first active layer through a third via.

3. The display panel according to claim 2, wherein the first transistor further comprises a first gate electrode located at a side of the first source electrode close to the first active layer;
wherein the driving unit further comprises a storage capacitor that comprises a first electrode plate and a second electrode plate, the first electrode plate and the first gate electrode are located in a same layer, and the second electrode plate is located between the first gate electrode and the first source electrode; and
wherein the first drain electrode and the first gate electrode are located in a same layer, or the first drain electrode and the second electrode plate are located in a same layer.

4. The display panel according to claim 1, wherein the second drain electrode is located at a side of the first drain electrode close to the substrate.

5. The display panel according to claim 4, wherein the first transistor further comprises a first gate electrode located at a side of the first source electrode close to the first active layer;
wherein the driving unit further comprises a storage capacitor that comprises a first electrode plate and a second electrode plate, the first electrode plate and the first gate electrode are located in a same layer, and the second electrode plate is located between the first gate electrode and the first source electrode; and
wherein the first drain electrode and the second electrode plate are located in a same layer, and the second drain electrode and the first gate electrode are located in a same layer.

6. The display panel according to claim 1, wherein the first active layer comprises silicon; and
wherein the driving unit further comprises a second transistor that comprises a second active layer, and the second active layer comprises an oxide semiconductor and is located at a side of the first active layer facing away from the substrate.

7. A display device, comprising the display panel according to claim 1.

8. A display panel, comprising:
a substrate;
a driving unit comprising a first transistor, the first transistor comprising a first source electrode and a first drain electrode; and
at least one light-emitting element, each of the at least one light-emitting element comprising a first electrode, a light-emitting layer, and a second electrode that are sequentially vertically stacked, the first electrode being connected to the first drain electrode through a first via, and the first drain electrode being located at a side of the first source electrode close to the substrate,
wherein the first source electrode and the first drain electrode are located at a side of the at least one light-emitting element close to the substrate, and wherein a material of the first drain electrode is different from a material of the first source electrode,
wherein the first transistor comprises a first active layer containing silicon;
wherein the driving unit further comprises a second transistor, and the second transistor comprises a second source electrode, a third drain electrode, a second gate electrode, and a second active layer;
wherein the second active layer comprises an oxide semiconductor and is located at a side of the first active layer facing away from the substrate, and the second source electrode, the third drain electrode, and the first source electrode are located in a same layer;
wherein the second gate electrode is located between the second active layer and the second source electrode, or located between the second active layer and the first active layer; and
wherein the first drain electrode and the second gate electrode are located in a same layer, or the first drain electrode and the second active layer are located in a same layer.

9. A display panel, comprising:
a substrate;
a driving unit comprising a first transistor, the first transistor comprising a first source electrode and a first drain electrode;
at least one light-emitting element, each of the at least one light-emitting element comprising a first electrode, a light-emitting layer, and a second electrode that are sequentially vertically stacked, the first electrode being connected to the first drain electrode through a first via, and the first drain electrode being located at a side of the first source electrode close to the substrate, and
a light shielding layer located between the first drain electrode and the first electrode and made of a material different from the material of the first drain electrode, wherein at least one first opening is formed in the light shielding layer, and an orthographic projection of the first via on the substrate is located within an orthographic projection of one of the at least one first opening on the substrate,
wherein the first source electrode and the first drain electrode are located at a side of the at least one light-emitting element close to the substrate, and wherein a material of the first drain electrode is different from a material of the first source electrode.

10. The display panel according to claim 9, wherein the material of the first source electrode is the same as a material of the light shielding layer.

11. The display panel according to claim 9, wherein the at least one light-emitting element comprises at least two light-emitting elements, the light shielding layer further comprises a plurality of imaging apertures that penetrate through the light shielding layer in a thickness direction of the light shielding layer, and an orthographic projection of one of the plurality of imaging apertures on the substrate is located between orthographic projections of two adjacent light-emitting elements of the at least two light-emitting elements on the substrate.

12. The display panel according to claim 11, further comprising:
a photosensitive module located at a side of each of the plurality of imaging apertures facing away from one of the at least two light-emitting elements, wherein the plurality of imaging apertures overlap the photosensitive module in a direction perpendicular to the display panel.

13. The display panel according to claim 11, wherein the display panel has a display region that comprises a fingerprint recognition region, and the plurality of imaging apertures is located in the fingerprint recognition region.

14. The display panel according to claim 11, further comprising:
a first planarization layer and a second planarization layer, wherein the driving unit is located between the substrate and one of the at least two light-emitting elements;
wherein the first planarization layer covers the driving unit, the light shielding layer covers and is located on the first planarization layer, and the second planarization layer covers and is located on the light shielding layer; and
wherein the first via penetrates through the first planarization layer and the second planarization layer.

15. The display panel according to claim 11, wherein the display panel has a display region, and the at least one light-emitting element comprises M light-emitting elements that are provided in the display region; and
in a direction perpendicular to the display panel, the light shielding layer overlaps the M light-emitting elements, and one of the M light-emitting elements corresponds to one of the at least one first opening.

16. The display panel according to claim 11, wherein an orthographic projection of the first electrode on the substrate covers an orthographic projection of one of the at least one first opening on the substrate.

17. The display panel according to claim 11, further comprising:
a power supply structure provided on the substrate, the light shielding layer being electrically connected to the power supply structure.

* * * * *